United States Patent
Sangyoji et al.

[11] Patent Number: 5,225,299
[45] Date of Patent: Jul. 6, 1993

[54] PHOTOSENSITIVE RECORDING MEDIUM AND METHOD AND APPARATUS FOR RECORDING IMAGES EMPLOYING THE SAME

[75] Inventors: Kazuo Sangyoji; Mitsuru Ohta, both of Nagoya, Japan

[73] Assignee: Brother Kogyo Kabushiki Kaisha, Nagoya, Japan

[21] Appl. No.: 381,329

[22] Filed: Jul. 18, 1989

[30] Foreign Application Priority Data

Jul. 18, 1988 [JP] Japan .................. 63-178434

[51] Int. Cl.$^5$ .................. G03G 5/00; G03G 13/22
[52] U.S. Cl. .................. 430/98; 430/138; 355/295
[58] Field of Search .................. 430/98, 110, 138; 355/27, 295

[56] References Cited

U.S. PATENT DOCUMENTS

| | | | |
|---|---|---|---|
| 4,443,095 | 4/1984 | Tsushima et al. | 355/14 R |
| 4,489,151 | 12/1984 | Sanders et al. | 430/138 |
| 4,740,809 | 4/1988 | Yamamoto et al. | 430/138 |
| 4,910,550 | 3/1990 | Ohashi et al. | 430/138 |
| 4,912,014 | 3/1990 | Feldman | 430/138 |
| 4,933,249 | 6/1990 | Mikami | 430/138 |
| 4,969,012 | 11/1990 | Suzuki et al. | 355/212 |
| 5,043,757 | 8/1991 | Sakai | 355/37 |

OTHER PUBLICATIONS

Schaffert, *Electrophotography*, 1975, p. 38, Focal Press.
Jacobson, *Imaging Systems*, 1976, p. 298, Focal Press.

*Primary Examiner*—John Goodrow
*Attorney, Agent, or Firm*—Oliff & Berridge

[57] ABSTRACT

A photosensitive recording medium for forming an image through reaction of a dye precursor with a developer material and method and apparatus for recording images employing such a photosensitive recording medium. The photosensitive pressure-sensitive recording medium comprises a base, an electrically conductive layer, a photoconductive layer being rendered electrically conductive in response to light, and microcapsules being variable in mechanical rupture strength by photopolymerization and containing a dye precursor. The image recording apparatus includes charging means for electrically charging such photosensitive pressure-sensitive recording medium and developer material applying means for applying a developer material to the exposed photosensitive pressure-sensitive recording medium. The image recording method includes the steps of electrically charging such photosensitive pressure-sensitive recording medium and applying a developer material to the exposed photosensitive pressure-sensitive recording medium.

6 Claims, 1 Drawing Sheet

PHOTOSENSITIVE RECORDING MEDIUM AND METHOD AND APPARATUS FOR RECORDING IMAGES EMPLOYING THE SAME

BACKGROUND OF THE INVENTION

The present invention relates to a photosensitive recording medium and method and apparatus for recording images employing the same, and more particularly to a photosensitive recording medium for forming an image through reaction of a dye precursor with a developer material and method and apparatus for recording images employing such a photosensitive recording medium.

Method of forming images through interaction between a photosensitive pressure-sensitive medium and a developer medium are disclosed in Japanese Laid-Open Patent Publication Nos. 61-137749, 61-143738, and 61-173981, for example. According to the disclosed methods, light having image information is applied to a photosensitive pressure-sensitive recording medium which is coated with microcapsules encapsulating a dye precursor and is variable in mechanical strength in response to light. The photosensitive pressure-sensitive recording medium that has been exposed to the light is then pressed against a developer medium that has been shipped as a product by a maker such as a paper manufacturer. Those microcapsules which remain unexposed and hence weaker in mechanical strength are now ruptured under pressure, allowing the dye precursor to flow out and react with a developer material on the developer medium, whereupon an image is formed on the developer medium. The developer medium is prepared by dispersing a developer material in an aqueous solution and then coating the dispersion on a desired medium.

As described above, the formation of a colored image through the photosensitive pressure-sensitive recording medium requires a developer medium carrying a developer material. Developer mediums include two types, that is, an existing developer medium which is prepared by the maker and a developer medium which is prepared by coating with developer material on a desired support in a recording apparatus. The former existing developer medium is coated on its entire surface with the developer material, and hence does not let the user have a developer medium which would be coated with the developer material in only a desired area. The latter developer medium produced by coating on the support with a dispersion comprising developer material particles dispersed in an aqueous solution. It is however difficult from the standpoint of maintenance of the recording apparatus to coat the developer material in a wet fashion on only a desired area on the support in the recording apparatus.

Another problem is that when a white area on an original to be copied is formed as a latent image on a photosensitive pressure-sensitive medium and then the image is developed under pressure in close contact with a developer medium, an area on the developer medium which should be white is not made white but has a slight shade of color. This is because a color is developed, even if slightly, in such an area on the developer medium which should be white.

SUMMARY OF THE INVENTION

The present invention has been made in an effort to solve the above problem. It is an object of the present invention to provide a photosensitive pressure-sensitive medium which can be coated with a developer material electrostatically in a dry fashion, which developer has heretofore been coated on a support in a wet fashion, so that an image can be transferred onto and formed in a desired area on a desired support.

Another object of the present invention is to provide an image recording apparatus and an image recording method which employ such a photosensitive pressure-sensitive medium.

According to one aspect of the present invention, the above object can be achieved by a photosensitive pressure-sensitive recording medium comprising a base supporting microcapsules which are variable in mechanical rupture strength by photopolymerization and contain a dye precursor, an electrically conductive layer and a photoconductive layer which is rendered electrically conductive in response to light are disposed on one surface of said base in the order named or in the order opposite thereto, the microcapsules being disposed on the photoconductive layer or on the other surface of the base.

According to another aspect of the present invention, the above object can be achieved by an image recording apparatus comprising charging means for electrically charging a photosensitive pressure-sensitive recording medium, exposure means for exposing the charged photosensitive pressure-sensitive recording medium to light representative of image information of an original, developer material applying means for applying a developer to the exposed photosensitive pressure-sensitive medium, developing means for superposing and pressing the photosensitive pressure-sensitive recording medium having the developer material applied thereto and an image forming medium.

According to still another aspect of the present invention, the above object can be achieved by an image recording method comprising the steps of electrically charging a photosensitive pressure-sensitive recording medium, exposing the charged photosensitive pressure-sensitive recording medium to light representative of image information of an original, applying a developer material to the exposed photosensitive pressure-sensitive medium, superposing and pressing the photosensitive pressure-sensitive recording medium having the developer material applied thereto and an image forming medium.

The photosensitive pressure-sensitive recording medium according to the present invention is wholly electrically charged by the charging means. Then, the photosensitive pressure-sensitive recording medium is exposed to light including image information of an original by the exposure means. As a result, an exposed area of the photoconductive layer of the photosensitive pressure-sensitive recording medium is rendered electrically conductive in response to light, and the charges flow from the exposed area into the electrically conductive layer. Therefore, different surface potentials are developed in the exposed and unexposed areas on the electrically conductive layer. Then, the developer material is electrostatically applied to the photosensitive pressure-sensitive recording medium under the surface potentials thereof. A desired medium such as a sheet of ordinary paper is held closely against the photosensitive pressure-sensitive recording medium with the developer material applied thereto, and the medium and the photosensitive pressure-sensitive recording medium are pressed together to develop a color and form a color image on the medium.

The above and other objects, feature and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENTS

The present invention will hereinafter be described with reference to the drawings which show embodiments of the invention.

Figure 1:
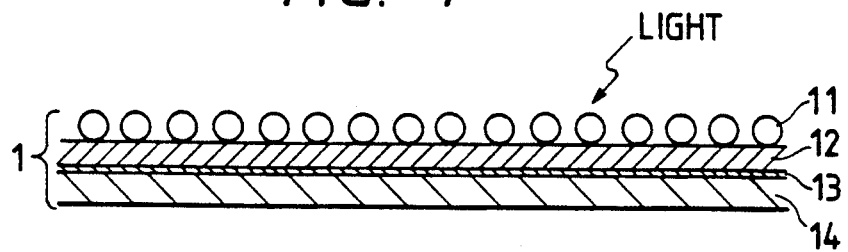
FIG. 1 is a cross-sectional view of a photosensitive pressure-sensitive recording medium according to an embodiment of the present invention.

FIG. 1 is cross-sectional view of a photosensitive pressure-sensitive recording medium 1 according to an embodiment of the present invention. The photosensitive pressure-sensitive recording medium 1 comprises a base 14, an electrically conductive layer 13 disposed on the base 14, a photoconductive layer 12 disposed on the layer 13, the photoconductive layer 12 being rendered electrically conductive in response to light, and a microcapsule layer 11 disposed on the layer 12. The base and layers are shown dimensionally exaggerated for illustrative purpose. The photosensitive pressure-sensitive recording medium 1 is manufactured as follows: The electrically conductive layer 13 is formed by evaporating aluminum or indium oxide on, or laminating aluminum foil to, or sputtering palladium or platinum onto, the base 14 which comprises a film of polyethylene terephthalate (PET) or polyethlene. Then, the photoconductive layer 12 is coated, vacuum-evaporated, or deposited by a glow discharge, on the electrically conductive base formed so far. The photoconductive layer 12 may be made of a photosensitive material such as ZnO, CdS Se, Se-Te, a(amorphous)-Si, an organic photosensitive material (OPC), or the like. The photoconductive layer 12 is then coated with the microcapsule layer 11. The photosensitive pressure-sensitive recording medium 1 thus produced can record image information through both electric discharge and photosensitive pressure-sensitive property.

Figure 2:
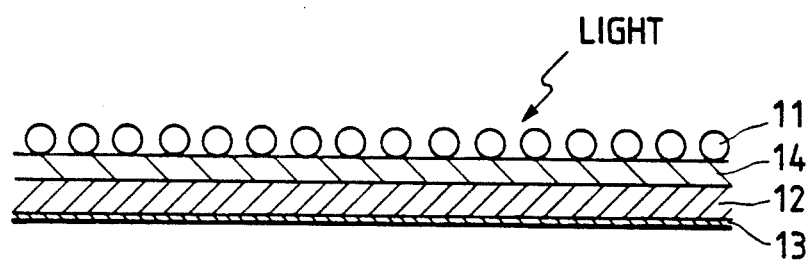
FIG. 2 is a cross-sectional view of a photosensitive pressure-sensitive recording medium according to another embodiment of the present invention.

FIG. 2 is a cross-sectional view of a photosensitive pressure-sensitive recording medium according to another embodiment of the present invention.

The photosensitive pressure-sensitive recording medium shown in FIG. 2 comprises an electrically conductive layer 13, a photoconductive layer 12 disposed on the electrically conductive layer 13, a base 14 disposed on the photoconductive layer 12, and a microcapsule layer 11 disposed on the base 14.

The base 14 may be any of various desired materials which are capable of passing light therethrough.

The principles of operation of the photosensitive pressure-sensitive recording medium as shown in FIGS. 1 and 2 will be described below.

When the photosensitive pressure-sensitive recording medium 1 shown in FIG. 1 is irradiated with light, the microcapsules in the microcapsule layer 11 selectively respond to red, green, and blue lights, and are selectively photocured and non-photocured, thus forming a latent image of microcapsules. A high negative voltage is applied to the photoconductive layer 12 to keep the surface thereof at a potential. Upon exposure of the layer 12 to light, electric charge flow from the layer 12 into an area on the layer 13 which is irradiated with the light, and the surface potential of the layer 12 drops. Therefore, when light representative of image information of an original to be copied is applied to the photoconductive layer 12, areas of the same potentials and lowered potentials are formed on the photoconductive layer 12. Accordingly, an electrostatic latent image is formed on the photoconductive layer 12 in exactly the same position as and below the microcapsule latent image on the microcapsule layer 11. This electrostatic latent image will be developed into a visible image by a developer material as described later on.

When the photosensitive pressure-sensitive recording medium 1 shown in FIG. 2 is irradiated with light, the light is applied to the microconductive layer 12, making the latter electrically conductive. Electric charges which have been given to the layer 12 flow into an area of the layer 13 which is irradiated with the light. Therefore, as with the embodiment of FIG. 1, when light representative of image information of an original to be copied is applied to the photoconductive layer 12, areas of the same and lowered potentials are formed on the photoconductive layer 12. Accordingly, an electrostatic latent image is formed on the photoconductive layer 12 in exactly the same position as and below the microcapsule latent image on the microcapsule layer 11.

An image recording apparatus according to the present invention for forming an image by employing the photosensitive pressure-sensitive recording medium 1 will be described below.

Figure 3:
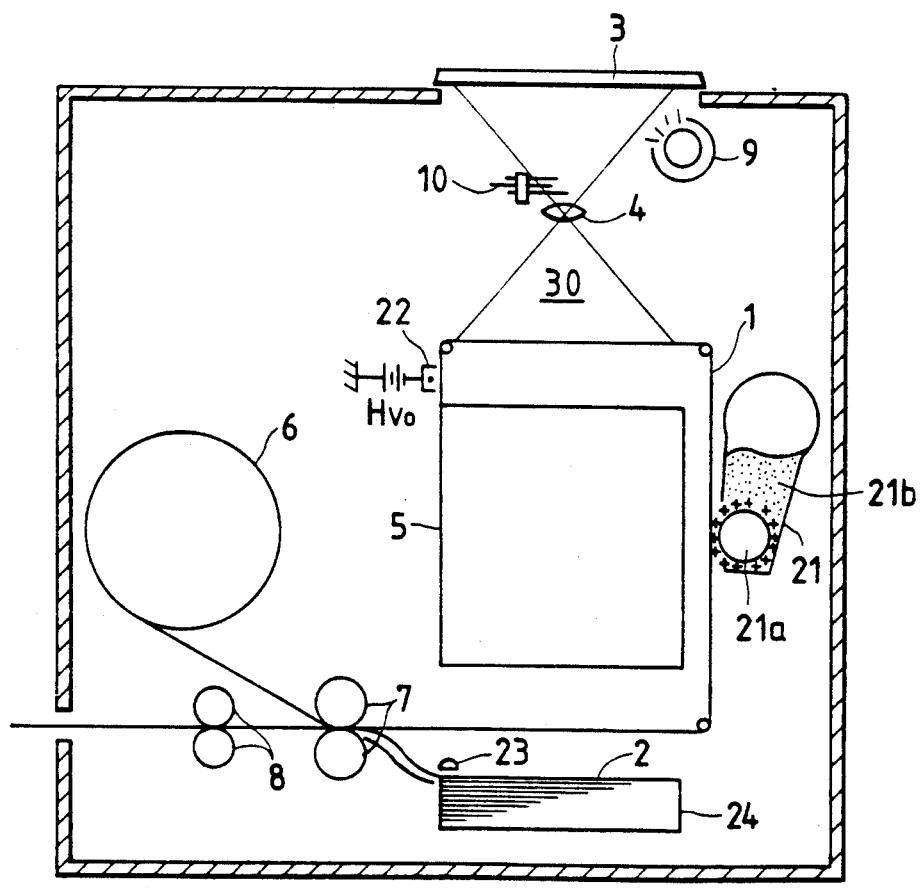
FIG. 3 is a schematic vertical cross-sectional view of an image recording apparatus according to the present invention which employs the photosensitive pressure-sensitive recording medium.

As illustrated in FIG. 3 the image recording apparatus includes an exposure unit 30 in which light from a light source 9 is applied to an original 3 and light reflected from the original 3 passes through a focusing lens 4 and a filter unit 10 and is focused onto the photosensitive pressure-sensitive recording medium 1 that has been supplied from a cartridge 5. The photosensitive pressure-sensitive recording medium 1 is fed along a feed path. Along the feed path, there are disposed the exposure unit 30, a charger 22 as a charging means connected to a high-negative-voltage power supply Hvo, a developer toner developing unit 21 as a developer developing means for electrostatically developing and fixing a developer material, a pressure developing roller 7 as a pressure developing means, and a thermal fixing roller 8 as a fixing means.

An image recording method according to the present invention will be described below as a sequence of operation of the image recording apparatus.

As the photosensitive pressure-sensitive recording medium 1 withdrawn from the cartridge 5 is fed along the feed path, the surface of the photosensitive pressure-sensitive recording medium 1 is uniformly electrically charged by the charger (charging means) 22. When light reflected from the original 3 is applied to the uniformly charged photosensitive pressure-sensitive recording medium 1, an electrostatic latent image is formed on the photoconductive layer 12 of the medium 1 as a combination of exposed and unexposed areas on the layer 12. At the same time, a microcapsule latent image is also formed on the microcapsule layer 11 as a combination of photocured and non-photocured microcapsules.

The developer toner developing unit (developer material developing means) 21 has a developer toner 21b and a developing sleeve 21a. A high voltage is applied to the developing sleeve 21a for electrostatically attracting the developer toner 21b to the unexposed area on the photosensitive pressure-sensitive recording medium 1, thereby coating the unexposed area with the developer material.

The photosensitive pressure-sensitive recording medium 1 which has been exposed to the light based on the image information of the original 3 and has formed the area coated with the developer toner 21b, is then delivered below the cartridge 5. A medium 2 is supplied by a semicircular roller 23 from a storage case 24 storing a stack of mediums such as ordinary paper sheets. The medium 2 is then positionally registered with and held intimately against the photosensitive pressure-sensitive medium 1 that has been delivered. The medium 2 and the photosensitive pressure-sensitive medium 1 are then pressed together by the pressure developing roller (pressure developing means) 7. As a result, the non-photocured microcapsules existing in the unexposed area on the photosensitive pressure-sensitive recording medium 1 are ruptured under pressure, letting the dye precursor flow out and react with the coated developer toner 21b coated on the photosensitive pressure-sensitive recording medium 1 to develop a color. In this manner, a colored image is formed on the medium 2. After the image has been developed under pressure, the photosensitive pressure-sensitive recording medium 1 is wound around a takeup roller 6. The developer toner 21 which forms the image on the medium 2 is then fixed by the thermal fixing roller (fixing means) 8.

As described above in detail, a developer material can electrostatically be coated on a desired area on the photosensitive pressure-sensitive recording medium of the present invention. Since no developer material is required to be coated in advance on a medium on which an image will finally be formed, any of desired mediums can be used as an image carrier.

No image is formed in any areas which are not coated with the developer material, and a clear white tone can be given at the non-coated area because of an inherent white color tone of the medium surface. In other wards, the inherent white color of the medium surface is much brilliantly white than a white color given by the chromogenic reaction.

What is claimed is:

1. A photosensitive pressure-sensitive recording medium comprising:
   a base;
   an electrically conductive layer disposed on one surface of said base;
   a photoconductive layer disposed on said electrically conductive layer, said photoconductive layer being rendered electrically conductive in response to light;
   microcapsules disposed on said photoconductive layer, said microcapsules being variable in mechanical rupture strength by photopolymerization and containing a dye precursor.

2. A photosensitive pressure-sensitive recording medium comprising:
   a base;
   a photoconductive layer disposed on one surface of said base, said photoconductive layer being rendered electrically conductive in response to light;
   an electrically conductive layer disposed on said photoconductive layer;
   microcapsules disposed on the other surface of said base, said microcapsules being variable in mechanical rupture strength by photopolymerization and containing a dye precursor.

3. An image recording apparatus for recording an image corresponding to an original on a recording medium, said recording medium including a photosensitive pressure-sensitive recording medium and an image forming medium, said apparatus comprising:
   charging means for electrically charging said photosensitive pressure-sensitive recording medium to a first polarity, said photosensitive pressure-sensitive recording medium comprising:
   a base;
   an electrically conductive layer disposed on one surface of said base;
   a photoconductive layer disposed on said electrically conductive layer, said photoconductive layer being rendered electrically conductive in response to light;
   microcapsules disposed on said photoconductive layer, said microcapsules being variable in mechanical rupture strength by photopolymerization and containing a dye precursor;
   exposure means for exposing the charged photosensitive pressure-sensitive recording medium to light representative of image information of said original;
   developer material applying means for applying a developer material precharged to a second polarity opposite to said first polarity to the exposed photosensitive pressure-sensitive recording medium so as to be attracted thereto;
   developing means for superposing and pressing said photosensitive pressure-sensitive recording medium having the developer material and said image forming medium.

4. An image recording apparatus for recording an image corresponding to an original on a recording medium, said recording medium including a photosensitive pressure-sensitive recording medium and an image forming medium, said apparatus comprising:
   charging means for electrically charging said photosensitive pressure-sensitive recording medium to a first polarity, said photosensitive pressure-sensitive recording medium comprising:
   a base;
   a photoconductive layer disposed on one surface of said base, said photoconductive layer being rendered electrically conductive in response to light;
   an electrically conductive layer disposed on said photoconductive layer;
   microcapsules disposed on the other surface of said base, said microcapsules being variable in mechanical rupture strength by photopolymerization and containing a dye precursor;
   exposure means for exposing the charged photosensitive pressure-sensitive recording medium to light representative of image information of said original;

developer material applying means for applying a developer material precharged to a second polarity opposite to said first polarity to the exposed photosensitive pressure-sensitive recording medium so as to be attracted thereto;

developing means for superposing and pressing said photosensitive pressure-sensitive recording medium having the developer material and said image forming medium.

5. An image recording method for recording an image corresponding to an original on a recording medium, said recording medium including a photosensitive pressure-sensitive recording medium and an image forming medium, said method comprising the steps of:

charging electrically said photosensitive pressure-sensitive recording medium to a first polarity, said photosensitive pressure-sensitive recording medium comprising:

a base;

an electrically conductive layer disposed on one surface of said base;

a photoconductive layer disposed on said electrically conductive layer, said photoconductive layer being rendered electrically conductive in response to light;

microcapsules disposed on said photoconductive layer, said microcapsules being variable in mechanical rupture strength by photopolymerization and containing a dye precursor;

exposing the charged photosensitive pressure-sensitive recording medium to light representative of image information of said original to form latent images;

applying a developer material precharged to a second polarity opposite to said first polarity to the exposed photosensitive pressure-sensitive recording medium so as to be attracted thereto;

superposing and pressing said photosensitive pressure-sensitive recording medium having the developer material and said image forming medium.

6. An image recording method for recording an image corresponding to an original on a recording medium, said recording medium including a photosensitive pressure-sensitive recording medium and an image forming medium, said method comprising the steps of:

charging electrically said photosensitive pressure-sensitive recording medium to a first polarity, said photosensitive pressure-sensitive recording medium comprising:

a base;

a photoconductive layer disposed on one surface of said base, said photoconductive layer being rendered electrically conductive in response to light;

an electrically conductive layer disposed on said photoconductive layer; microcapsules disposed on the other surface of said base, said microcapsules being variable in mechanical rupture strength by photopolymerization and containing a dye precursor;

exposing the charged photosensitive pressure-sensitive recording medium to light representative of image information of said original to form latent images;

applying a developer material precharged to a second polarity opposite to said first polarity to the exposed photosensitive pressure-sensitive recording medium so as to be attracted thereto;

superposing and pressing said photosensitive pressure-sensitive recording medium having the developer material and said image forming medium.

* * * * *